United States Patent
Nagarajan et al.

(10) Patent No.: US 11,152,942 B2
(45) Date of Patent: Oct. 19, 2021

(54) THREE-INPUT EXCLUSIVE NOR/OR GATE USING A CMOS CIRCUIT

(71) Applicant: SAMSUNG ELECTRONICS CO., LTD., Suwon-si (KR)

(72) Inventors: Hareharan Nagarajan, Karnataka (IN); Abhishek Ghosh, Karnataka (IN); Sajal Mittal, Karnataka (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/807,640

(22) Filed: Mar. 3, 2020

(65) Prior Publication Data
US 2021/0167781 A1 Jun. 3, 2021

(30) Foreign Application Priority Data
Nov. 29, 2019 (IN) .............................. 201941049135

(51) Int. Cl.
*H03K 19/21* (2006.01)
*H03K 19/0948* (2006.01)

(52) U.S. Cl.
CPC ....... *H03K 19/215* (2013.01); *H03K 19/0948* (2013.01)

(58) Field of Classification Search
CPC .................. H03K 19/0948; H03K 19/215
See application file for complete search history.

(56) References Cited

U.S. PATENT DOCUMENTS

| | | | | |
|---|---|---|---|---|
| 5,736,868 A | * | 4/1998 | Kim | .......... H03K 19/215 326/55 |
| 5,852,540 A | * | 12/1998 | Haider | .......... H02H 9/046 361/111 |
| 5,936,427 A | * | 8/1999 | Tsujihashi | .......... H03K 19/215 326/54 |
| 7,557,614 B1 | * | 7/2009 | Bonsels | .......... H03K 19/215 326/54 |
| 7,570,081 B1 | | 8/2009 | Harris et al. | |
| 7,719,806 B1 | * | 5/2010 | Boyd | .......... H01L 27/027 361/56 |
| 7,843,219 B2 | | 11/2010 | Moon | |

(Continued)

FOREIGN PATENT DOCUMENTS

CN 101527628 9/2009

*Primary Examiner* — Kurtis R Bahr
(74) *Attorney, Agent, or Firm* — F. Chau & Associates, LLC

(57) ABSTRACT

A CMOS transistor circuit including: a first block generating a first output signal of a NOR state, in response to first and second input signals; a second block including a first AND-OR gate, the second block generating a second output signal of an OR or an AND state, the second block receiving the first and second input signals and the first output signal; a third block generating a third output signal of the NOR state, in response to a third input signal and the second output signal; a fourth block including a second AND-OR gate, the fourth block generating a fourth output signal of the OR or the AND state in response to the third input signal, the second output signal and the third output signal; and a fifth block including an inverter gate, the fifth block generating a fifth output signal in response to the fourth output signal.

8 Claims, 15 Drawing Sheets

(56) References Cited

U.S. PATENT DOCUMENTS

| | | | |
|---|---|---|---|
| 8,610,488 B2* | 12/2013 | Yu | H01L 27/0266 |
| | | | 327/410 |
| 8,975,922 B2 | 3/2015 | Stoica et al. | |
| 8,994,412 B2* | 3/2015 | Kim | H03K 19/018521 |
| | | | 327/109 |
| 2006/0255852 A1* | 11/2006 | O'Donnell | H03K 17/08142 |
| | | | 327/437 |
| 2010/0141324 A1* | 6/2010 | Wang | H03K 19/018521 |
| | | | 327/333 |
| 2010/0271118 A1* | 10/2010 | Bhattacharya | H03K 17/0822 |
| | | | 327/543 |
| 2010/0277202 A1* | 11/2010 | Becker | G06F 30/39 |
| | | | 326/54 |
| 2012/0049939 A1* | 3/2012 | Maede | H03K 19/0185 |
| | | | 327/537 |
| 2016/0372918 A1* | 12/2016 | Chen | H02H 9/04 |
| 2019/0158085 A1* | 5/2019 | Rizvi | H03K 19/017509 |
| 2020/0104444 A1* | 4/2020 | Baratam | H03K 19/21 |

\* cited by examiner

THREE-INPUT EXCLUSIVE NOR/OR GATE USING A CMOS CIRCUIT

CROSS-REFERENCE TO RELATED APPLICATION

This application claims priority under 35 U.S.C. § 119 to Indian Patent Application No. 201941049135, filed on Nov. 29, 2019, in the Indian Intellectual Property Office, the disclosure of which is incorporated by reference herein in its entirety.

TECHNICAL FIELD

This present inventive concept relates to digital logic circuits, and more particularly to circuits for implementing exclusive OR/NOR (XOR/XNOR) gate logic functions using a Complementary Metal Oxide Semiconductor (CMOS) transistor circuit.

DISCUSSION OF RELATED ART

Various types of logic circuits are used for high-speed operations and two highly used digital logic circuits are "Exclusive-OR" circuits (also referred to herein as "XOR" circuits) and "Exclusive NOR" circuits (also referred to herein as "XNOR" circuits). The XOR circuit may produce a logical one, if an odd number of inputs are a logical 'one' and the XNOR logic function is the inverse of the XOR function. The XNOR function will produce a logical 'one', if an even number of inputs are a logical one or a logical zero. Accordingly, the XNOR circuit and XOR circuit may be used in high density standard cell libraries, high speed standard cell libraries, high-speed Arithmetic Logic Units (ALUs), and so on.

FIG. 1a illustrates a conventional diagram of an arithmetic logic unit (ALU). In conventional systems, a number of XOR gates 105 may be used in an arithmetic hardware chip. In general, different types of XOR circuit designs such as 2-input XOR, 3-input XOR, high-speed XOR, area-efficient XOR, and low-power XOR, may be used for different purposes. In arithmetic hardware designs, a large number of XOR gates may be used and different topologies of XOR gates may be used, depending on design requirements. In the ALU of FIG. 1a, there is further shown a look-up table (LUT) 110 that contains pre-computed direction vectors. Outputs of the LUT 110, e.g., Vi to Vn, are provided as inputs n to the XOR gates 105. The ALU may further include n-bit binary counters 115 connected to respective XOR gates 105. The XOR gates 105 may produce outputs L1 to Lp.

FIG. 1b illustrates a conventional diagram of a 3 input XNOR gate circuit. The conventional 3 input XNOR gate circuit may include a transmission gate and a tri-state inverter. Further, the layout of the conventional XNOR gate circuit may require more diffusion breaks which may lead to an increase in the number of grids in the layout and an increase in the area of the XNOR circuit. The conventional 3 input XNOR gate circuit may utilize 3 input inverters to the transmission gate. However, the inputs may not be directly provided to the source/drain of the transmission gate, as the input capacitance may vary with respect to the input condition. Ideally, the input capacitance is constant irrespective of the input toggling. Accordingly, the conventional 3 input XNOR gate circuit may require inverted input signals to operate.

As can be seen, a conventional 3 input XNOR gate circuit and XOR gate circuit may have considerable leakage and may occupy a large area.

SUMMARY

An exemplary embodiment of the present inventive concept disclosed herein provides a Complementary Metal Oxide Semiconductor (CMOS) transistor circuit configured to implement an exclusive NOR (XNOR) function comprising: a first block configured to generate a first output signal corresponding to a NOR gate logic state, in response to a first input signal and a second input signal; a second block comprising a first AND-OR gate connected with an output node of the first block, wherein the second block is configured to generate a second output signal corresponding to an OR gate logic state or an AND gate logic state, wherein the second block is configured to receive the first input signal, the second input signal and the first output signal of the first block; a third block connected with an output node of the second block, wherein the third block is configured to generate a third output signal corresponding to the NOR gate logic state, in response to a third input signal and the second output signal of the second block; a fourth block comprising a second AND-OR gate circuit connected with an output node of the third block, wherein the fourth block is configured to generate a fourth output signal corresponding to the OR gate logic state or the AND gate logic state in response to the third input signal, the second output signal of the second block and the third output signal of the third block; and a fifth block comprising an inverter gate circuit connected with an output node of the fourth block, wherein the fifth block is configured to generate a fifth output signal in response to the fourth output signal of the fourth block.

An exemplary embodiment of the present inventive concept disclosed herein provides a CMOS transistor circuit configured to implement an exclusive NOR (XNOR) function comprising: a first block and a third block configured to generate a first output signal and a third output signal respectively, wherein first output signal and the third output signal correspond to a NAND gate logic state; a second block comprising a first OR-AND gate and configured to generate a second output signal corresponding to an OR gate logic state and a fourth block comprising a second OR-AND gate configured to generate a fourth output signal corresponding to an AND gate logic state; and a fifth block comprising an inverter gate circuit coupled to an output node of the fourth block, wherein the fifth block is configured to generate a fifth output signal in response to the fourth output signal of the fourth block.

An exemplary embodiment of the present inventive concept provides a CMOS transistor circuit configured to implement an exclusive NOR (XNOR) function comprising: a first block and a third block configured to generate a first output signal and a third output signal respectively, wherein the first and second output signals correspond to at least one of a NAND gate logic state and a NOR gate logic state; and a second block and a fourth block comprising at least one of an OR-AND gate and an AND-OR gate respectively, wherein the second block and the fourth block are configured to generate a second output signal and a fourth output signal corresponding to at least one of an OR gate logic state and an AND gate logic state.

An exemplary embodiment of the present inventive concept disclosed herein provides a CMOS transistor circuit configured to implement an exclusive OR (XOR) function comprising: a first block configured to generate a first output signal corresponding to a NAND gate logic state, in response to a first input signal and a second input signal; a second block comprising a first OR-AND gate coupled in series with an output node of the first block, wherein the second block is configured to generate a second output signal corresponding to at least one of an OR gate logic state and an AND gate logic state, wherein the second block is configured to receive the first input signal, the second input signal and the first output signal of the first block; a third block coupled in series with an output node of the second block, wherein the third block comprises sixth and seventh p-channel Metal Oxide Semiconductor (PMOS) transistors in series and sixth and seventh n-channel Metal Oxide Semiconductor (NMOS) transistors in parallel and is configured to generate a third output signal corresponding to a NOR gate logic state, in response to a third input signal and the second output signal of the second block; a fourth block comprising a second AND-OR gate circuit coupled in series with an output node of the third block, wherein the fourth block comprises eighth and ninth PMOS transistors in parallel and eighth and ninth NMOS transistors in series and is configured to generate a fourth output signal corresponding to at least one of the OR gate logic state and the AND gate logic state in response to the third input signal, the second output signal of the second block, and the third output signal of the third block; and a fifth block comprising an inverter gate circuit coupled to an output node of the fourth block, wherein the fifth block is configured to generate a fifth output signal in response to the fourth output signal of the fourth block.

An exemplary embodiment of the present inventive concept disclosed herein provides a CMOS transistor circuit configured to implement an exclusive NOR (XNOR) function comprising: a plurality of circuit blocks comprising a NOR gate circuit and an AND-OR gate circuit; and at least one NOR gate circuit and at least one AND-OR gate circuit connected in series in each of the circuit blocks.

An exemplary embodiment of the present inventive concept disclosed herein provides a method for implementing an exclusive NOR (XNOR) function using a CMOS transistor circuit comprising: generating, at a first block, a first output signal corresponding to a NOR gate logic state, in response to a first input signal and a second input signal; generating, at a second block comprising a first AND-OR gate connected with an output node of the first block, a second output signal corresponding to an OR gate logic state or an AND gate logic state in response to the first input signal, the second input signal and the first output signal of the first block; generating, at a third block connected with an output node of the second block, a third output signal corresponding to the NOR gate logic state, in response to a third input signal and the second output signal of the second block; generating, at a fourth block comprising a second AND-OR gate circuit connected with an output node of the third block, a fourth output signal corresponding to the OR gate logic state or the AND gate logic state in response to the third input signal, the second output signal of the second block and the third output signal of the third block; and generating, at a fifth block comprising an inverter gate circuit connected with an output node of the fourth block, a fifth output signal in response to the fourth output signal of the fourth block.

BRIEF DESCRIPTION OF FIGURES

The above and other features of the present inventive concept will be more clearly understood by describing in detail exemplary embodiments thereof with reference to the drawings, in which.

DETAILED DESCRIPTION OF THE EMBODIMENTS

Figure 1A:
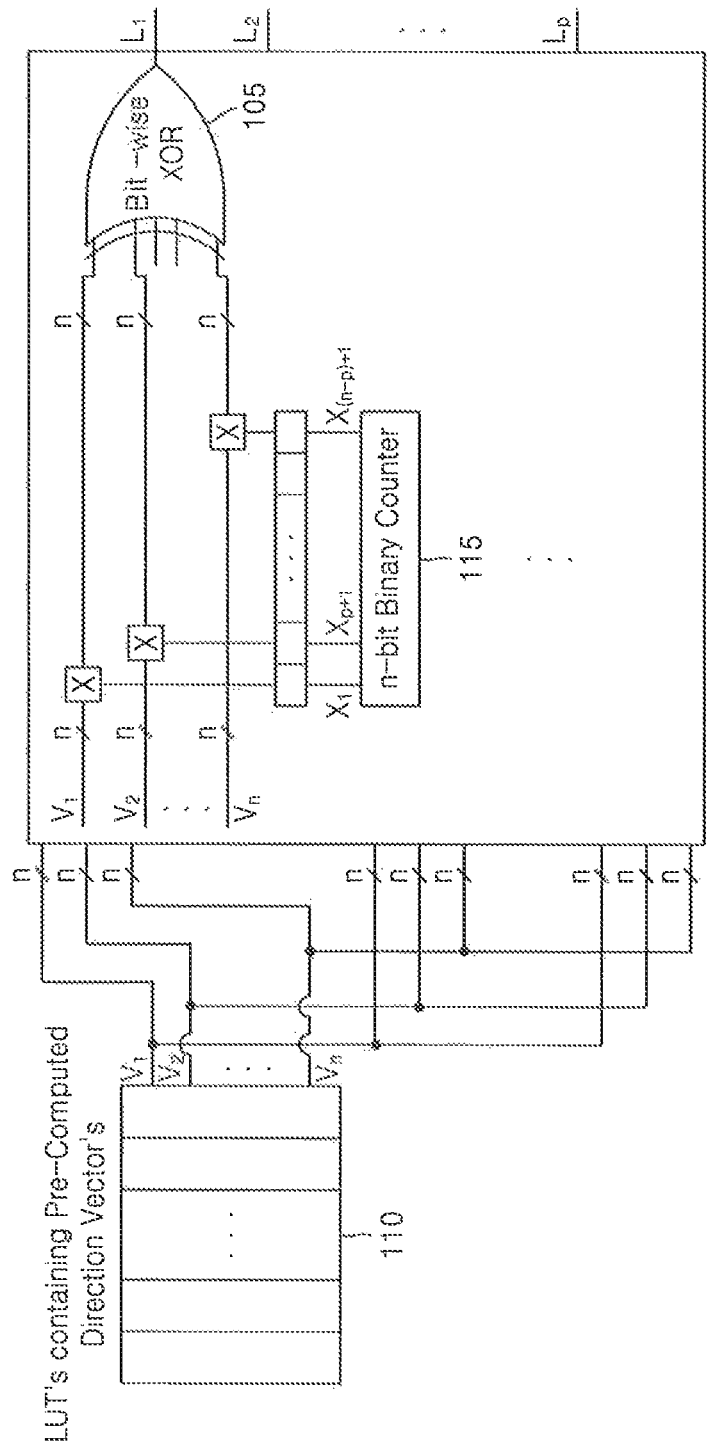
FIG. 1a illustrates a conventional diagram of an arithmetic logic unit (ALU)
Figure 1B:
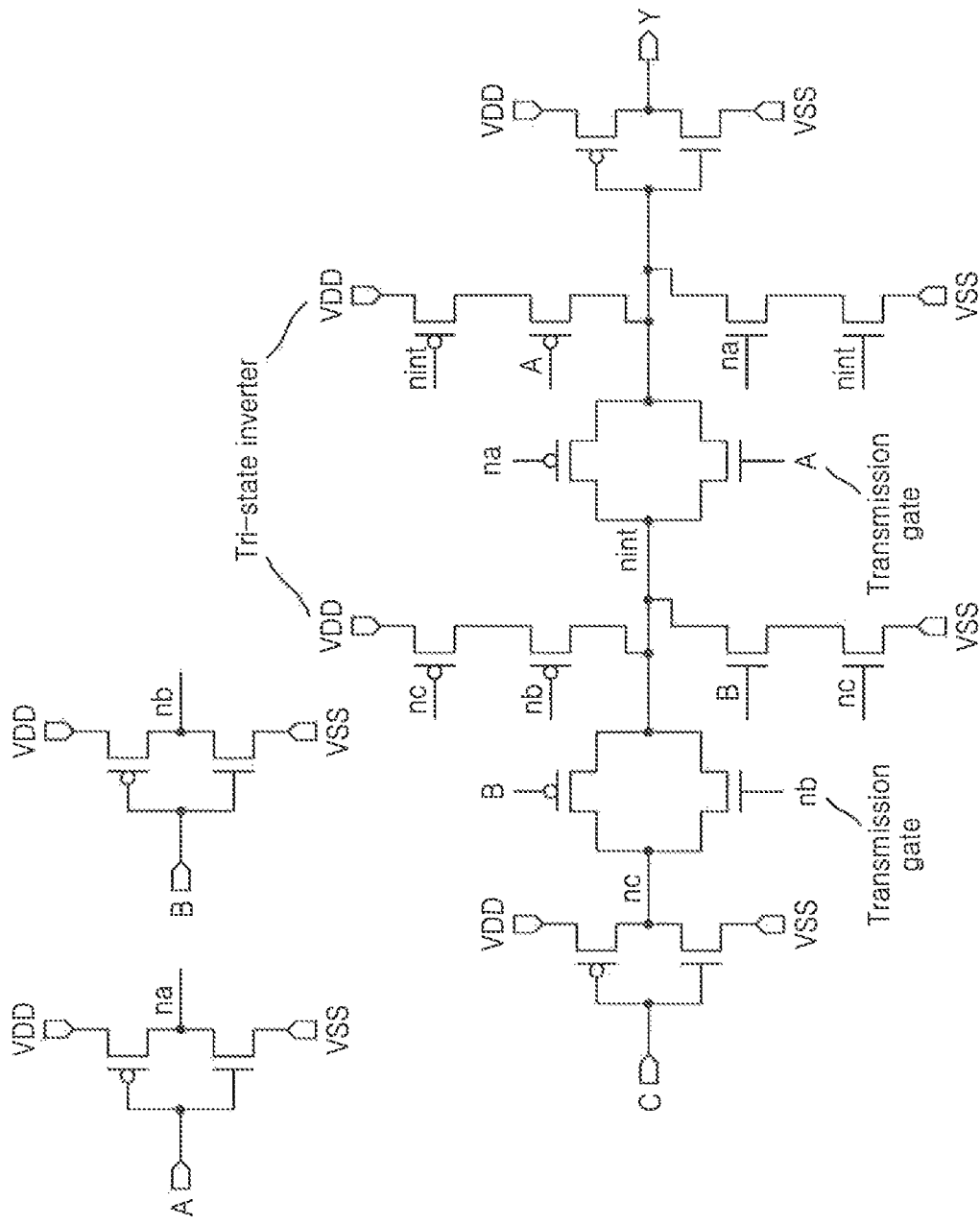
FIG. 1b illustrates a conventional diagram of a 3 input XNOR gate circuit.

Hereinafter, exemplary embodiments of the present inventive concept will be explained more fully with reference to the accompanying drawings. It is to be understood, however, that the present inventive concept is not limited to the exemplary embodiments disclosed herein.

In the drawings, similar reference characters may denote like elements, and thus, repetitive descriptions may not be provided.

It will be understood that when an element is referred to as being "coupled" or "connected" to another element, it can be directly coupled or connected to the other element or intervening elements may also be present.

The exemplary embodiments of the present inventive concept disclosed herein provide a 3 input exclusive NOR/OR gate using a Complementary Metal Oxide Semiconductor (CMOS) circuit.

Figure 2:
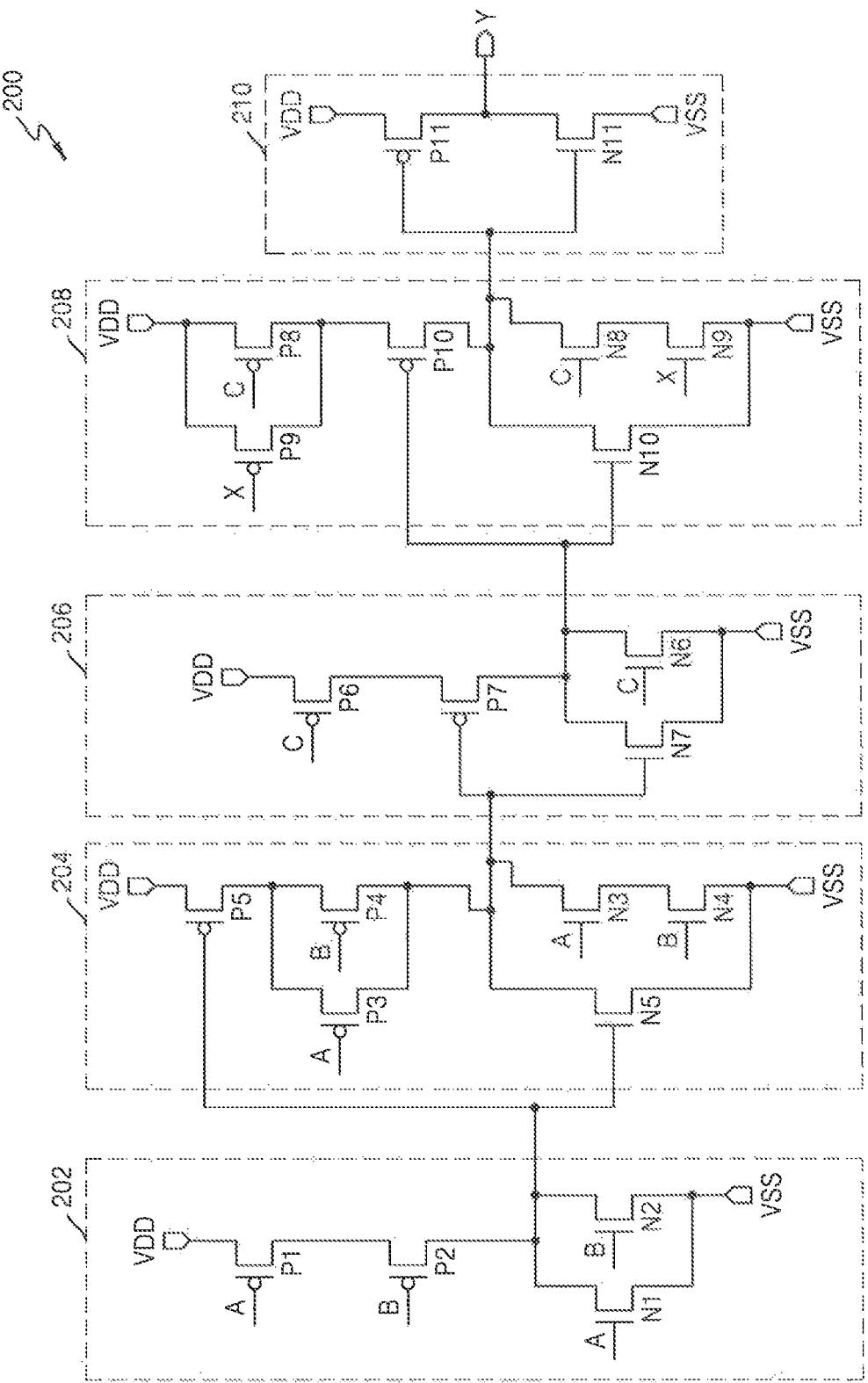
FIG. 2 illustrates a 3 input exclusive NOR/OR gate using a Complementary Metal Oxide Semiconductor (CMOS) transistor circuit, according to exemplary embodiments of the present inventive concept.

FIG. 2 illustrates a 3 input exclusive NOR/OR gate using a CMOS transistor circuit 200, according to exemplary embodiments of the present inventive concept.

The CMOS transistor circuit 200 includes circuit blocks such as a first block 202, a second block 204, a third block 206, a fourth block 208 and a fifth block 210. An output from the first block 202 can be a first output signal; an output from the second block 204 can be a second output signal, and so on. The circuit blocks may be interchanged/altered according to design specific requirements. Exemplary embodiments disclosed herein may implement a 3 input exclusive NOR/OR (XNOR/XOR) gate using the CMOS transistor circuit 200. However, the CMOS transistor circuit 200 may be implemented for other logic gate circuits and with other combinations of inputs such as 2 inputs, 4 inputs, 5 inputs, and so on. In addition, the CMOS transistor circuit 200 may include a plurality of p-type Metal Oxide Semiconductor (PMOS) transistors and a plurality of n-type Metal Oxide Semiconductor (NMOS) transistors. The PMOS transistors and NMOS transistors may be added/removed based on the design specific requirements, to save area in the CMOS transistor circuit 200, or to reduce metal routing congestion.

In an exemplary embodiment of the present inventive concept, the XNOR circuit and XOR circuit may be used in at least one of, but not limited to, a high density standard cell library, a high speed standard cell library, a high-speed Arithmetic Logic Unit (ALU), and so on. In an exemplary embodiment of the present inventive concept, the XNOR logic gate may be used in error detecting circuits which can be used to detect odd parity or even parity bits in digital data transmission circuits. In an exemplary embodiment of the present inventive concept, the XNOR gate may be used in arithmetic and encryption circuits. For example, the CMOS transistor circuit 200 may be used to ring an alarm when a water temperature level goes up or down, to a pre-set level.

In an exemplary embodiment of the present inventive concept, the exclusive-NOR/OR gate circuit may include a NOR gate, a NAND gate, an AND gate, an OR gate, a AND-OR gate, a NOT gate, a PMOS transistor (which functions as a pull-up element), a NMOS transistor (which functions as a pull-down element), and so on. In an exemplary embodiment of the present inventive concept, the NOR gate can perform a NOR operation on input signals such as A and B. In an exemplary embodiment of the present inventive concept, the NAND gate can perform a NAND operation on the input signals such as A and B.

In an exemplary embodiment of the present inventive concept, the NOR gate may be a CMOS type gate. In an exemplary embodiment of the present inventive concept, the AND-OR gate may be a CMOS type gate. In an exemplary embodiment of the present inventive concept, the NOT gate may be a CMOS type gate. The NOR gate, also referred to as the NOR gate circuit, may include a plurality of PMOS transistors P1, P2, P6 and P7, which are connected in series between a power supply voltage VDD and an output node of the NOR gate. A plurality of NMOS transistors N1, N2, N6 and N7 can be connected in parallel between the output node of the NOR gate and a ground voltage VSS. The gates of the PMOS transistors P1 and P2 can receive input signals A and B respectively. The gates of the NMOS transistors N1 and N2 can receive the input signals A and B respectively. The gates of the PMOS transistors P6 and P7 can receive input signals C and X respectively. X is an output from the AND-OR gate. The gates of the NMOS transistors N6 and N7 can receive the input signals C and X respectively.

The AND-OR gate may include a plurality of PMOS transistors P3, P4, P5, P8, P9, and P10, and a plurality of NMOS transistors N3, N4, N5, N8, N9, and N10. The PMOS transistors P3, and P4. P8 and P9 are connected in parallel, and their gates receive inputs A and B, C and X respectively. The PMOS transistors P5, and P10 are connected in series with P3 and P4, P8 and P9 respectively, between the power supply voltage VDD and the output node of the AND-OR gate. The gates of PMOS transistors P5, and P10 receive inputs from a previous circuit (e.g., the NOR gate). Further, the NMOS transistors N3 and N4, N8 and N9 are connected in series between the output node and the ground voltage VSS, respectively. The NMOS transistors N5 and N10 are connected in parallel with the NMOS transistors N3 and N4, N8 and N9 respectively. The gate terminals of the NMOS transistors N3 and N4, N8 and N9 receive inputs from A and B, C and X respectively. The gates of the NMOS transistors N5 and N10 receive inputs from a previous circuit (e.g., the NOR gate).

According to exemplary embodiments of the present inventive concept, the PMOS transistors (P1 to P10) may be moved/altered to form a series and parallel combination, and the NMOS transistors (N1 to N10) may be moved/altered to form a series and parallel combination. Further, operations of the exclusive-NOR/OR gate circuit may be the same even though the PMOS and NMOS transistors are moved or altered according to design requirements. The transistors P1, and N1 work as a complementary pair, transistors P2 and N2 work as a complementary pair, and each pair may be controlled by a single input signal.

When the input signals (A, B) to the NOR gate circuit, are different, in other words, when one input signal (A) is a high level (e.g., '1') and the other input signal (B) is a low level (e.g., '0'), the PMOS transistors P1 and P2 may be turned off and turned on respectively, and the NMOS transistors N1 and N2 may be turned on and turned off respectively. When one input signal (A) is the low level and the other input signal (B) is the high level, the PMOS transistors P1 and P2 may be turned on and turned off respectively and the NMOS transistors N1 and N2 may be as a result turned off and turned on respectively. In this case, a low level output signal, which is the voltage ground, may be outputted from the NOR gate circuit.

When the input signals (A,B) are identical, e.g., when the input signals (A,B) are both the high level, the PMOS transistors P1 and P2 are both turned off, and the NMOS transistors N1 and N2 are both turned on. As a result, a low level output signal, which is the voltage ground, may be outputted from the NOR gate circuit.

When the input signals (A,B) are identical, e.g., when the input signals (A,B) are both the low level, the PMOS transistors P1 and P2 are both turned on, and the NMOS transistors N1 and N2 are both turned off. As a result, a high level output signal, which is the power supply voltage VDD, may be outputted from the NOR gate circuit.

The NMOS transistors N1 or N2 and the PMOS transistors P1 or P2 may transfer an output (e.g., the first output signal) signal from an output node of the NOR gate to the gates of the PMOS and NMOS transistors P5 and N5, when the output signal from the first block 202 is "high". The NAND gate circuit may be operated conversely to the above-mentioned NOR gate circuit depicted in FIG. 2. For example, when the input signals (A, B) are different and when both are low, a high level output signal is outputted by the NAND gate circuit. When the input signals (A, B) are high, a low level output signal is outputted by the NAND gate circuit.

In an exemplary embodiment of the present inventive concept, the CMOS transistor circuit 200 is configured to implement an exclusive NOR (XNOR) function of three input signals by including the first block 202 which is configured to generate a first output signal corresponding to a NOR gate logic state, using a first input signal and a second input signal received via an input node of its transistors.

In an exemplary embodiment of the present inventive concept, the second block 204 comprises first AND-OR gate circuit coupled in series with the output node of the first block 202. The second block 204 is configured to generate a second output signal corresponding to an OR gate logic state or an AND gate logic state. In an exemplary embodiment of the present inventive concept, the second block 204 is configured to receive the first input signal, the second input signal and the first output signal via an input node of its transistors.

In an exemplary embodiment of the present inventive concept, the third block 206 is coupled in series with the output node of the second block 204. The third block 206 is configured to generate a third output signal corresponding to the NOR gate logic state, using a third input signal and the second output signal received via an input node of its transistors.

In an exemplary embodiment of the present inventive concept, the fourth block 208 comprises a second AND-OR gate circuit coupled in series with the output node of the third block 206. The fourth block 208 is configured to generate a fourth output signal corresponding to the OR gate logic state or the AND gate logic state. In an exemplary embodiment of the present inventive concept, the fourth block 208 is configured to receive the third input signal, the second output signal and the third output signal via an input node of its transistors.

In an exemplary embodiment of the present inventive concept, the fifth block 210 comprises an inverter gate circuit coupled to the output node of the fourth block 208 and is configured to generate a fifth output signal Y using the fourth output signal received via an input node of its transistors.

The following description will refer to the components of the CMOS transistor circuit 200 of FIG. 2, but the configuration of these components may be different from that shown in FIG. 2. In this embodiment, the first block 202 outputs a signal corresponding to a NAND gate logic state.

In an exemplary embodiment of the present inventive concept, the first block 202 of the CMOS transistor circuit 200, includes the PMOS transistors P1 and P2 in parallel and the NMOS transistors N1 and N2 in series. The first block 202 is configured to generate the first output signal corresponding to a NAND gate logic state.

In an exemplary embodiment of the present inventive concept, the second block 204 of the CMOS transistor circuit 200, includes the PMOS transistors P3 and P4 in series and the NMOS transistors N3 and N4 in parallel. The second block 204 is configured to receive the first input signal and the second input signal (e.g., A and B). In an exemplary embodiment of the present inventive concept, the first output signal from the first block 202 is inputted to the second block 204 via an input node of the PMOS transistor P5 and the NMOS transistor N5.

In an exemplary embodiment of the present inventive concept, the third block 206 of the CMOS transistor circuit 200 includes the PMOS transistors P6 and P7 in parallel and the NMOS transistors N6 and N7 in series. The third block 206 is configured to receive the second output signal and the third input signal via an input node of the PMOS and NMOS transistors P6, and N6 and transistors P7, and N7 respectively.

In an exemplary embodiment of the present inventive concept, the fourth block 208 of the CMOS transistor circuit 200 includes the PMOS transistors P8 and P9 in series and the NMOS transistors N8 and N9 in parallel. The fourth block 208 is configured to receive the second output signal and the third input signal. In addition, the fourth block 208 comprises the PMOS transistor P10 connected in parallel with the PMOS transistors P8 and P9 and the NMOS transistor N10 connected in series with the NMOS transistors N8 and N9. The fourth block 208 can receive the third output signal via an input node thereof.

In an exemplary embodiment of the present inventive concept, the fifth block 210 of the CMOS transistor circuit 200 includes the inverter gate circuit coupled to the output node of the fourth block 208. The fifth block 210 is configured to generate the fifth output signal Y using the fourth output signal received via the input node of the PMOS transistor P11 and the NMOS transistor N11.

The following description will refer to the components of the CMOS transistor circuit 200 of FIG. 2, and the configuration of these components may be the same as that shown in FIG. 2. In this embodiment, the first block 202 outputs a signal corresponding to a NOR gate logic stat.

In an exemplary embodiment of the present inventive concept, the CMOS transistor circuit can be implemented as an XOR function of three input signals. In an exemplary embodiment of the present inventive concept, the third block 206 of the CMOS transistor circuit 200 includes the PMOS transistors P6 and P7 in series and the NMOS transistors N6, and N7 in parallel. The third block 206 can receive the third input signal and the second output signal from the second block 204.

In an exemplary embodiment of the present inventive concept, the fourth block 208 of the CMOS transistor circuit 200 includes the PMOS transistors P8 and P9 in parallel and the NMOS transistors N8 and N9 in series. The fourth block 208 can receive the second output signal and the third input signal. In an exemplary embodiment of the present inventive concept, the PMOS transistor P10 is connected in series with the PMOS transistors P8, and P9 and the NMOS transistor N10 is connected in parallel with the NMOS transistors N8, and N9. The PMOS transistor P10 can receive the third output signal.

In an exemplary embodiment of the present inventive concept, the first block 202 of the CMOS transistor circuit 200 includes the PMOS transistors P1 and P2 in series and the NMOS transistors N1 and N2 in parallel. The first block 202 can generate the first output signal corresponding to the NOR gate logic state.

In an exemplary embodiment of the present inventive concept, the second block 204 of the CMOS transistor circuit 200 includes the PMOS transistors P3 and P4 in parallel and the NMOS transistors N3 in series. The second block 204 can receive the first input signal and the second input signal. In an exemplary embodiment of the present inventive concept, the first output signal from the first block 202 is inputted to the second block 204 via the input node of the PMOS transistor P5 and the NMOS transistor N5.

In an exemplary embodiment of the present inventive concept, the first block 202, the second block 204, the third block 206, the fourth block 208 and the fifth block 210 of the CMOS transistor circuit 200 are connected in series or parallel to each other. In an embodiment, the CMOS transistor circuit 200 comprises pull-up PMOS transistors P1-P11 and pull down NMOS transistors N1-N11 connected in at least one of a series, a parallel, a series-parallel and a parallel-series manner.

In an exemplary embodiment of the present inventive concept, the first output signal from the first block 202 is inputted to the second block 204 via an input node of the PMOS transistor P5 and the NMOS transistor N5, wherein the PMOS transistor P5 is in parallel with the PMOS transistors P3, and P4 and the NMOS transistor N5 is in series with the NMOS transistors N3 and N4.

Although, the present inventive concept been described with reference to specific embodiments, various modifications can be made thereto. For example, by interchanging the input A with its complement A and vice versa while retaining the inputs B and C, the logic gates may function as XNOR gates, XOR gates, depending on the inputs A, B and C. In an exemplary embodiment of the present inventive concept, the CMOS transistor circuit 200 may also include a plurality of first blocks 202 connected together in series as initial stages, and a second block 204 connected in series as the final stage. In addition, the output of the second block 204 may be connected to an output driver without the fifth block 210.

Figure 3A:
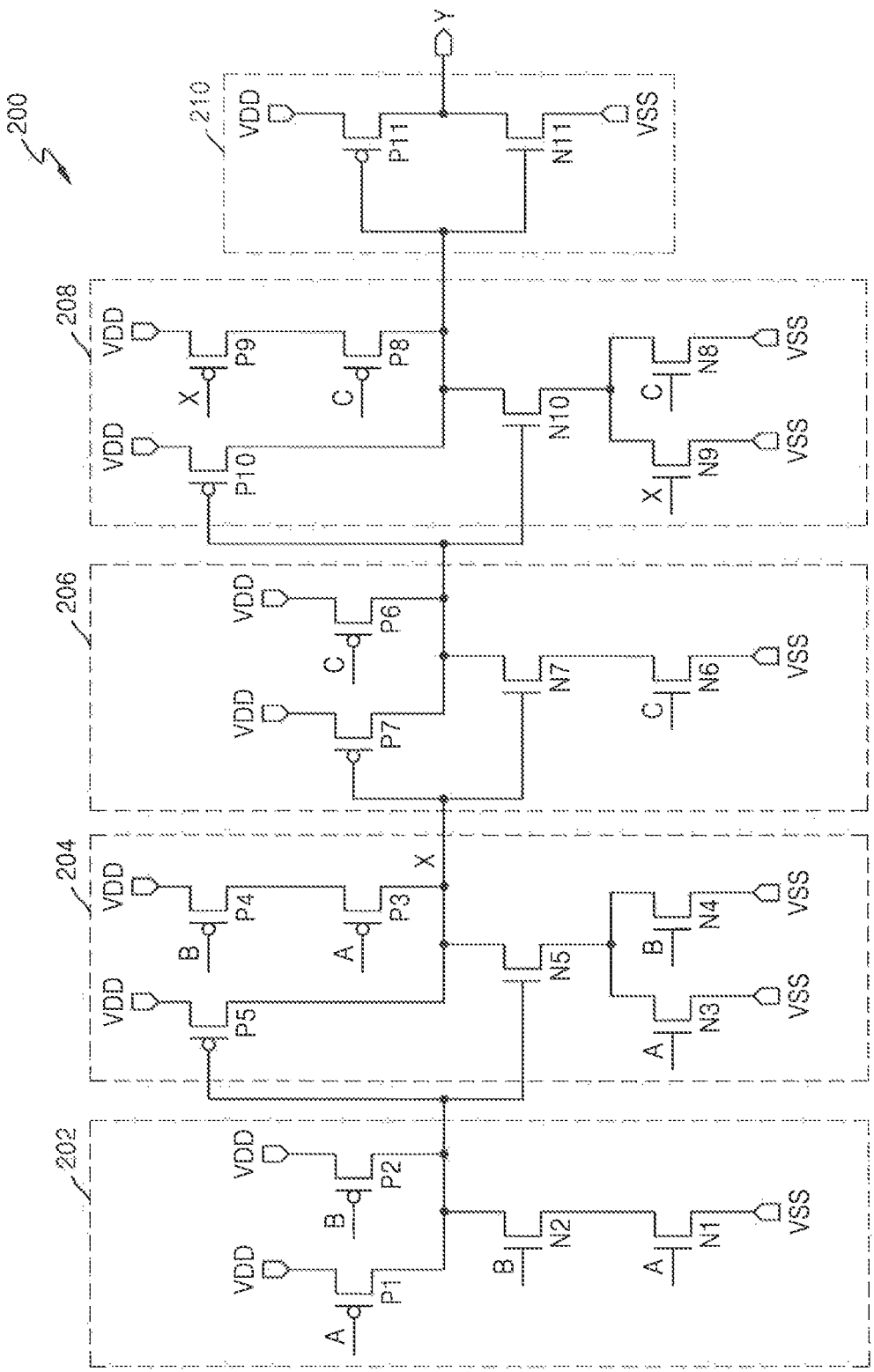
FIG. 3a illustrates a circuit diagram of a 3 input XNOR gate comprising a NAND gate circuit in both a first block and a third block, according to exemplary embodiments of the present inventive concept.

FIG. 3a illustrates a circuit diagram of a 3 input XNOR gate comprising a NAND gate circuit in the first block 202 and the third block 206, according to exemplary embodiments of the present inventive concept.

In an exemplary embodiment of the present inventive concept, the 3 input XNOR gate may also include the NAND gate circuit and the AND-OR gate circuit. The first block 202 comprises the PMOS transistors P1 and P2 in parallel and the NMOS transistors N1 and N2 in series. The first block 202 is configured to generate the first output signal corresponding to the NAND gate logic state.

The second block 204 comprises the PMOS transistors P3 and P4 in series and the NMOS transistors N3 and N4 in parallel. The second block 204 can receive the first input signal and the second input signal. In an exemplary embodiment of the present inventive concept, the first output signal from the first block 202 is inputted to the second block 204 via an input node of the PMOS transistor P5 and the NMOS transistor N5.

In an exemplary embodiment of the present inventive concept, the third block 206 comprises the PMOS transistors P6 and P7 in parallel and the NMOS transistors N6 and N7 in series. The third block 206 is configured to receive the second output signal (e.g., X) and the third input signal (e.g., C) via an input node of the PMOS and NMOS transistors P7 and N7 and the PMOS and NMOS transistors P6 and N6 respectively.

In an exemplary embodiment of the present inventive concept, the fourth block 208 comprises the PMOS transistors P8 and P9 in series and the NMOS transistors N8 and N9 in parallel. The fourth block 208 can receive the second output signal and the third input signal. The fourth block 208 comprises the PMOS transistor P10 (which is connected in parallel with the PMOS transistors P8 and P9) and a NMOS transistor N10 (which is connected in series with the NMOS transistors N8, and N9). The fourth block 208 can receive the third output signal via an input node. For example, the third output signal may be provided to the PMOS transistor P10 and the NMOS transistor N10.

In an exemplary embodiment of the present inventive concept, the fifth block 210 comprising the inverter gate circuit coupled to the output node of the fourth block 208 is configured to generate the fifth output signal Y using the fourth output signal received via the input node of the PMOS transistor P11 and the NMOS transistor N11.

The NAND gate in the first block 202 may include the PMOS transistors P1 and P2 which are connected in parallel between the power supply voltage VDD and the output node of the NAND gate. The NMOS transistors N1 and N2 are connected in series between the output node of the NAND gate and the ground voltage VSS. The gates of the PMOS transistors P1 and P2 receive the input signals A and B respectively. For example, the first and second input signals. The gates of the NMOS transistors N1 and N2 receive the input signals A and B respectively. Accordingly, if the inputs A and B both are low, both the PMOS transistors P1 and P2 may be turned on, and both the NMOS transistors N1 and N2 may be turned off. Thus, the first output signal will be charged to the power supply voltage VDD level. If the input A is low and the input B is high, the PMOS transistor P1 is turned on, the PMOS transistor P2 is turned off, the NMOS transistor N1 is turned off and the NMOS transistor N2 is turned off. This in turn results in the first output signal being maintained at the level of the power supply voltage VDD (e.g., high). If the input A is high and the input B is low, the PMOS transistor P1 is tuned off, the PMOS transistor P2 is turned on, the NMOS transistor N1 is turned on and the NMOS transistor N2 is turned off. This in turn results in the first output signal being maintained at the level of the power supply voltage VDD; (e.g., high). If the input A is high and the input B is high, the PMOS transistors P1 and P2 are turned off, and the NMOS transistors N1 and N2 are turned on. When both the PMOS transistors P1 and P2 are OFF, an output signal may not find a path to connect with the power supply voltage VDD. When the NMOS transistors N1 and N2 are turned on, the series connected NMOS transistors N1 and N2 may create a path from the output node to the ground voltage VSS. Since, the path to the ground may be established, the first output signal may be discharged (e.g., the first output signal may go to the low level).

Figure 3B:
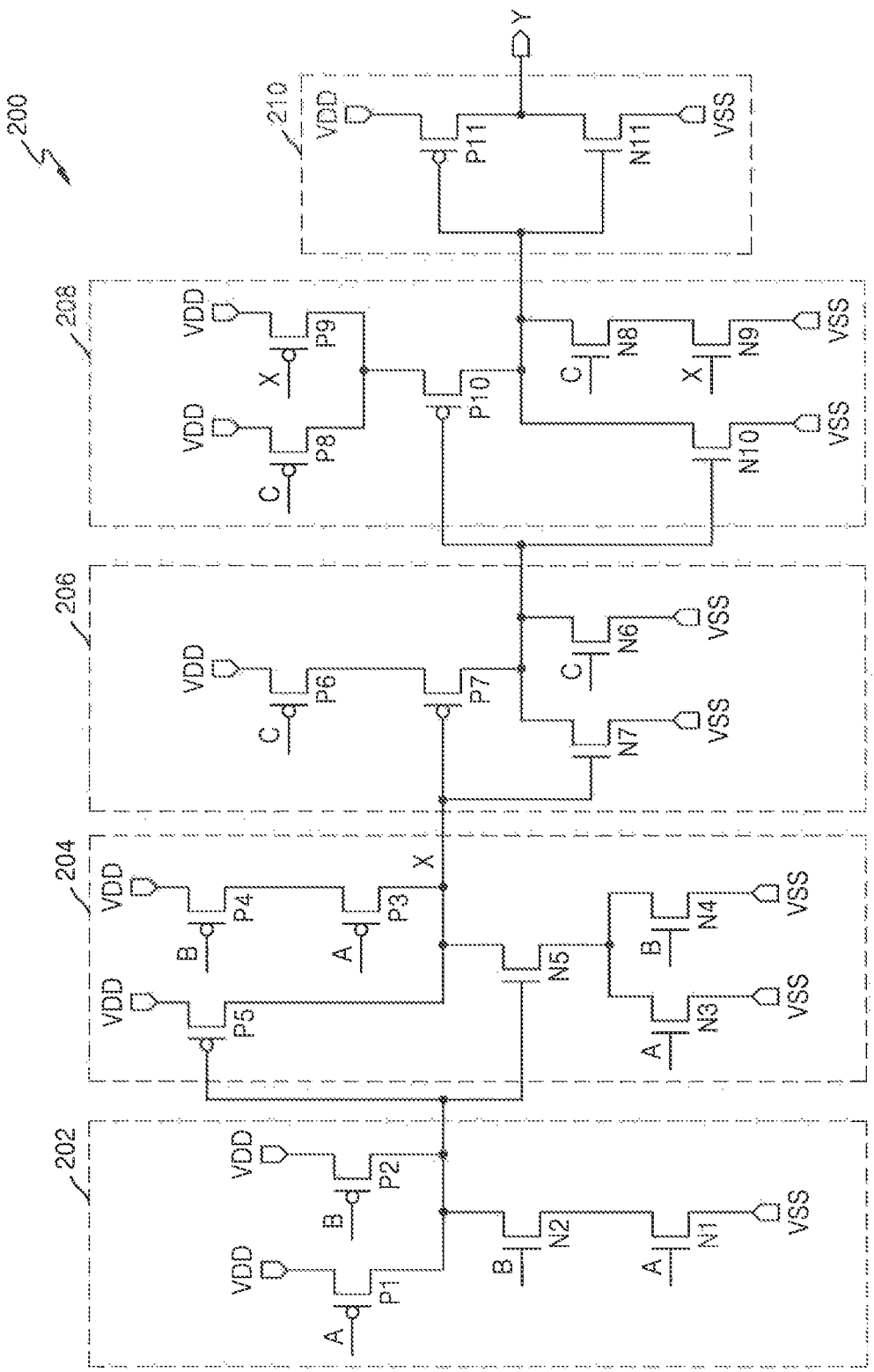
FIG. 3b illustrates a circuit diagram of a 3 input XOR gate comprising the NAND gate in the first block and a NOR gate in the third block, according to exemplary embodiments of the present inventive concept.

FIG. 3b illustrates a circuit diagram of a 3 input XOR gate comprising a NAND gate in first block 202 and a NOR gate in third block 206, according to exemplary embodiments of the present inventive concept.

In an exemplary embodiment of the present inventive concept, the first block 202 comprises the PMOS transistors P1 and P2 in parallel and the NMOS transistors N1 and N2 in series. The first block 202 is configured to generate the first output signal corresponding to the NAND gate logic state. The second block 204 comprises the PMOS transistors P3 and P4 in series and the NMOS transistors N3 and N4 in parallel. The second block 204 is configured to receive the first input signal (e.g., A) and the second input signal (e.g., B) respectively. In an exemplary embodiment of the present inventive concept, the first output signal from the first block 202 is inputted to the second block 204 via an input node of the PMOS transistor P5 and the NMOS transistor N5. The third block 206 comprises the PMOS transistors P6 and P7 in series and the NMOS transistors N6 and N7 in parallel. The third block 206 is configured to receive the third input signal (e.g., C) and the second output signal from the second block 204. The fourth block 208 comprises the PMOS transistors P8 and P9 in parallel and the NMOS transistors N8 and N9 in series. The fourth block 208 is configured to receive the second output signal (e.g., X) and the third input signal (e.g., C). The PMOS transistor P10 is connected in series with the PMOS transistors P8 and P9 and the NMOS transistor N10 is connected in parallel with the NMOS transistors N8 and N9. The fourth block is also configured to receive the third output signal via the PMOS and NMOS transistors P10 and N10.

Figure 3C:
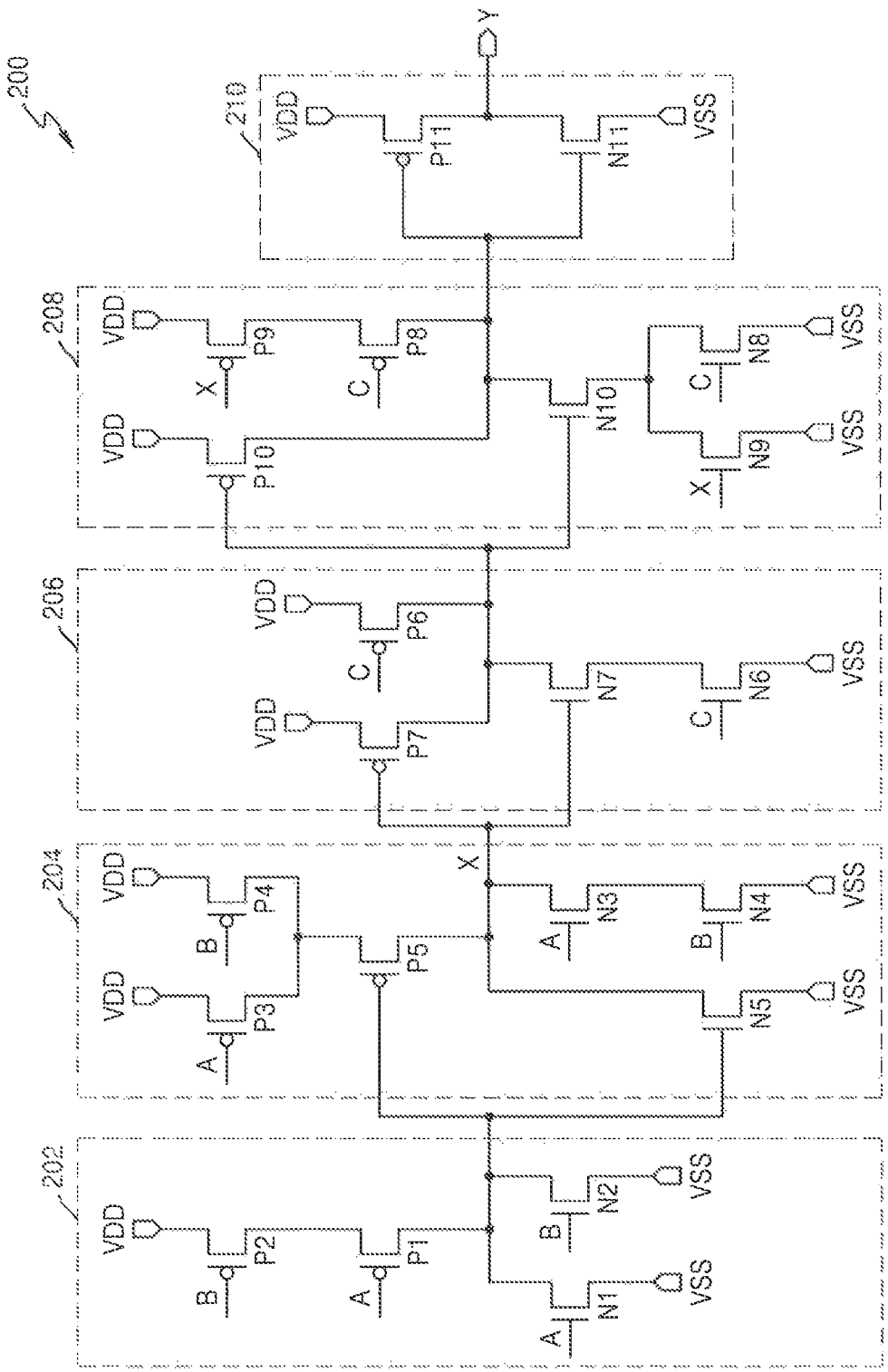
FIG. 3c illustrates a circuit diagram of a 3 input XOR gate comprising the NOR gate in the first block and the NAND gate in the third block, according to exemplary embodiments of the present inventive concept.

FIG. 3c illustrates a circuit diagram of a 3 input XOR gate comprising the NOR gate in first block 202 and the NAND gate in third block 206, according to exemplary embodiments of the present inventive concept.

In an exemplary embodiment of the present inventive concept, the first block 202, comprising the PMOS transistors P1 and P2 in series and the NMOS transistors N1 and N2 in parallel, is configured to generate the first output signal corresponding to the NOR gate logic state. The second block 204, comprising the PMOS transistors P3 and P4 in parallel and the NMOS transistors N3 and N4 in series, is configured to receive the first input signal and the second input signal. The PMOS transistor P5 is connected in series with the PMOS transistors P3 and P4. The NMOS transistor N5 is connected in parallel with the NMOS transistors N3 and N4. The first output signal from the first block 202 is inputted to the second block 204, via the input node of the PMOS transistor P5 and the NMOS transistor N5. In an exemplary embodiment of the present inventive concept, the third block 206 comprises the PMOS transistors P6 and P7 in parallel with each other and the NMOS transistors N6 and N7 in series with each other. The third block 206 is configured to receive the second output signal and the third input signal via an input node of the PMOS and NMOS transistors P7, and N7 and the PMOS and NMOS transistors P6, and N6 respectively. In an exemplary embodiment of the present inventive concept, the fourth block 208 comprises the PMOS transistors P8 and P9 in series with each other and the NMOS transistors N8 and N9 in parallel with each other. The fourth block 208 is configured to receive the second output signal and the third input signal. The PMOS transistor P10 in the fourth block 208 is connected in parallel with the PMOS transistors P8 and P9. The NMOS transistor N10 in the fourth block 208 is connected in series with the NMOS transistors N8 and N9. The fourth block 208 is configured to receive the third output signal via an input node. In an exemplary embodiment of the present inventive concept, the fifth block 210 comprises the inverter gate circuit coupled to the output node of the fourth block 208. The fifth block 210 is configured to generate the fifth output signal using the fourth output signal received via the input node of the PMOS transistor P11 and the NMOS transistor N11.

Figure 3D:
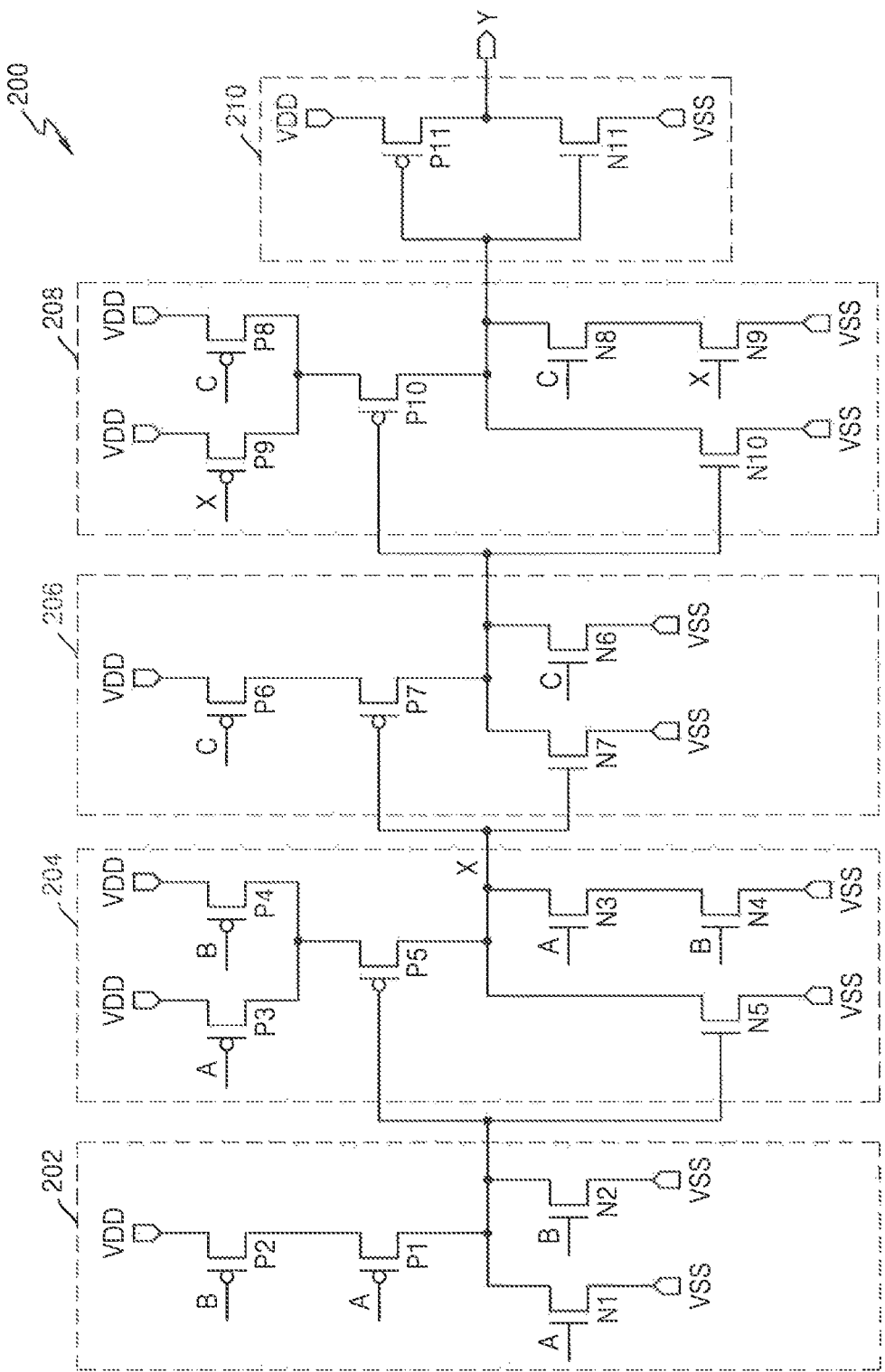
FIG. 3d illustrates a circuit diagram of a 3 input XNOR gate comprising the NOR gate in the first block and the third block, according to exemplary embodiments of the present inventive concept.

FIG. 3d illustrates a 3 input XNOR gate comprising the NOR gate in the first block 202 and the third block 206, according to exemplary embodiments of the present inventive concept.

In an exemplary embodiment of the present inventive concept, the first block 202 comprising the PMOS transistors P1 and P2 in series and the NMOS transistors N1 and N2 in parallel, is configured to generate the first output signal corresponding to the NOR gate logic state. The second block 206, comprising the PMOS transistors P3 and P4 in parallel and the NMOS transistors N3 and N4 in series, is configured to receive the first input signal and the second input signal. The PMOS transistor P5 is connected in series with the PMOS transistors P3 and P4 and the NMOS transistor N5 is connected in parallel with the NMOS transistors N3 and N4. The PMOS transistor P5 and the NMOS transistor N5 are configured to receive the first output signal. In an exemplary embodiment of the present inventive concept, the third block 206, comprising the PMOS transistors P6 and P7 in series and the NMOS transistors N6 and N7 in parallel, is configured to generate the third output signal corresponding to the NOR gate logic state. The fourth block 208 comprising the PMOS transistors P8 and P9 in parallel and the NMOS transistors N8 and N9 in series, is configured to receive the second output signal and the third input signal. The PMOS transistor P10 is connected in series with the PMOS transistors P8 and P9 and the NMOS transistor N10 is connected in parallel with the NMOS transistors N8 and N9. The PMOS transistor P10 and the NMOS transistor N10 are configured to receive the third output signal.

Figure 3E:
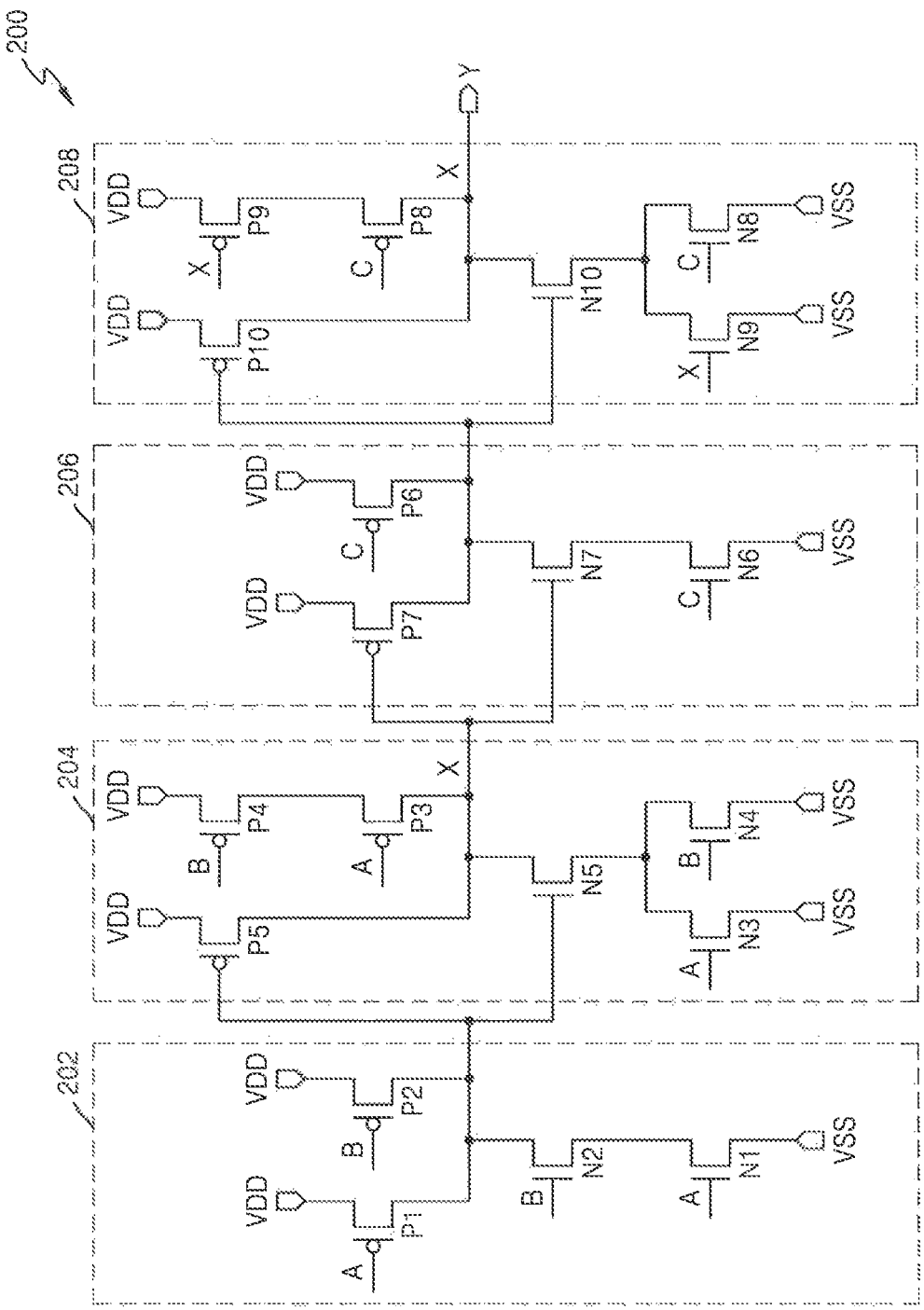
FIG. 3e illustrates a circuit diagram of a 3 input XOR gate comprising the NAND gate in the first block and the third block, according to exemplary embodiments of the present inventive concept.

FIG. 3e illustrates a circuit diagram of the 3 input XOR gate comprising the NAND gate in first block 202 and the third block 206, according to exemplary embodiments of the present inventive concept.

In an exemplary embodiment of the present inventive concept, the first block 202 comprising the PMOS transistors P1 and P2 in parallel and the NMOS transistors N1 and N2 in series, is configured to generate the first output signal corresponding to the NAND gate logic state. The second block 204 comprising the PMOS transistors P3 and P4 in series and the NMOS transistors N3 and N4 in parallel, is configured to receive the first input signal and the second input signal respectively. In an exemplary embodiment of the present inventive concept, the first output signal from the first block 202 is inputted to the second block 204 via an input node of the PMOS transistor P5 and the NMOS transistor N5. In an exemplary embodiment of the present inventive concept, the third block 206 comprising the PMOS transistors P6 and P7 in parallel and the NMOS transistors N6 and N7 in series, is configured to generate the third output signal corresponding to the NAND gate logic state. The fourth block 208 comprising the PMOS transistors P8 and P9 in series and the NMOS transistors N8 and N9 in parallel, is configured to receive the first input signal and the second input signal respectively. In an exemplary embodiment of the present inventive concept, the third output signal from the third block 206 is inputted to the fourth block 208 via an input node of the PMOS transistor P10 and the NMOS transistor N10. The PMOS transistor P10 is connected in parallel with the PMOS transistors P8 and P9 and the NMOS transistor N10 is connected in series with the NMOS transistors N8 and N9. In this embodiment, Y is the fourth output signal.

Figure 3F:
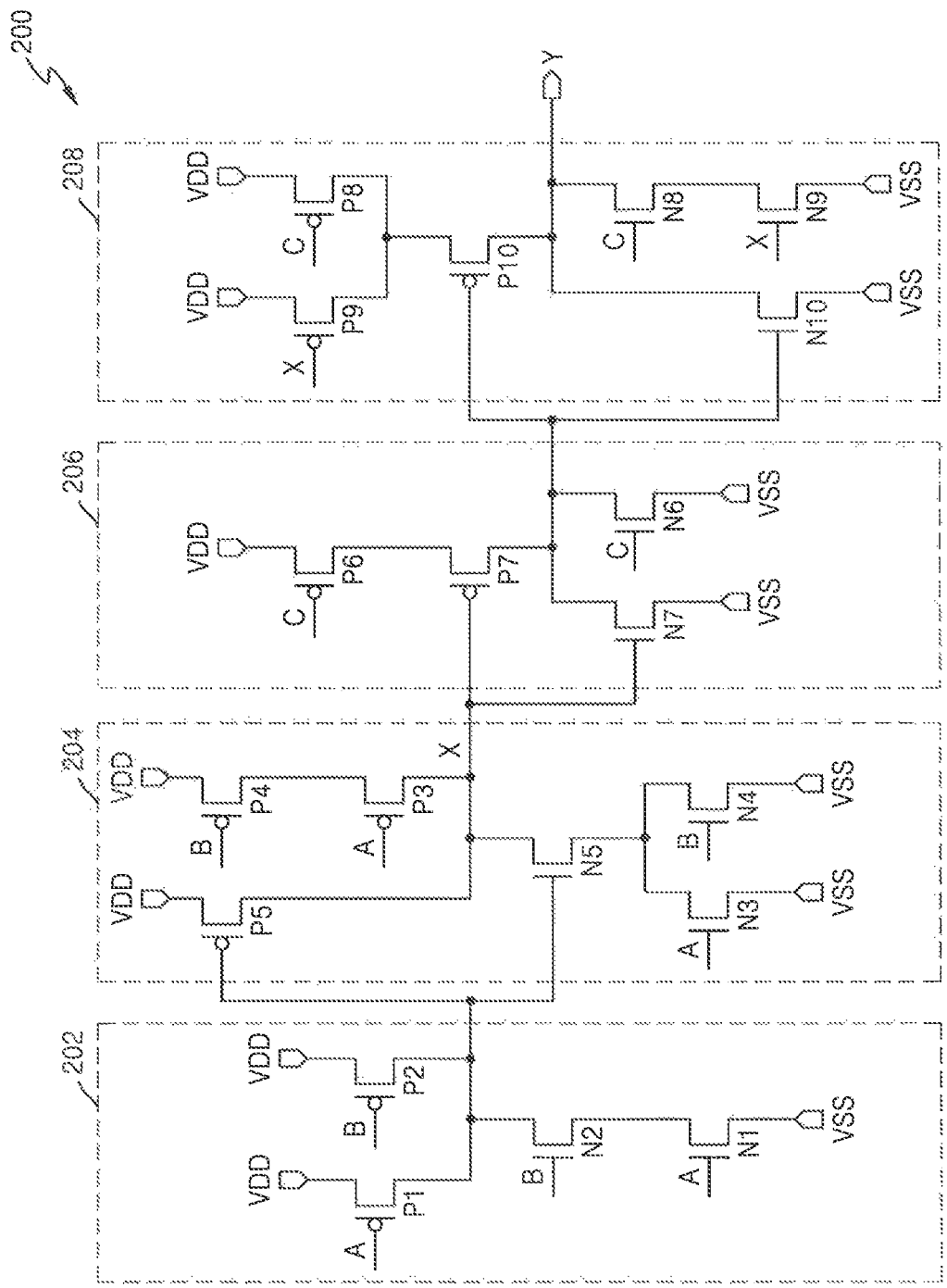
FIG. 3f illustrates a circuit diagram of a 3 input XNOR gate comprising the NAND gate in the first block and the NOR gate in the third block, according to exemplary embodiments of the present inventive concept.

FIG. 3f illustrates a circuit diagram of the 3 input XNOR gate comprising the NAND gate in first block 202 and the NOR gate in the third block 206, according to exemplary embodiments of the present inventive concept.

In an exemplary embodiment of the present inventive concept, the first block 202 comprising the PMOS transistors P1 and P2 in parallel and the NMOS transistors N1 and N2 in series, is configured to generate the first output signal corresponding to the NAND gate logic state. The second block 204 comprising the PMOS transistors P3 and P4 in series and the NMOS transistors N3 and N4 in parallel, is configured to receive the first input signal and the second input signal respectively. In an exemplary embodiment of the present inventive concept, the first output signal from the first block 202 is inputted to the second block 204 via an input node of the PMOS transistor P5 and the NMOS transistor N5. The third block 206 comprising the PMOS transistors P6 and P7 in series and the NMOS transistors N6 and N7, in parallel is configured to receive the third input signal and the second output signal from the second block 204. The fourth block 208 comprising the PMOS transistors P8 and P9 in parallel and the NMOS transistors N8 and N9 in series, is configured to receive the second output signal and the third input signal. The PMOS transistor P10 is connected in series with the PMOS transistors P8 and P9. The NMOS transistor N10 is connected in parallel with the NMOS transistors N8, and N9. The PMOS transistor P10 and the NMOS transistor N10 are configured to receive the third output signal from the third block 206.

Figure 3G:
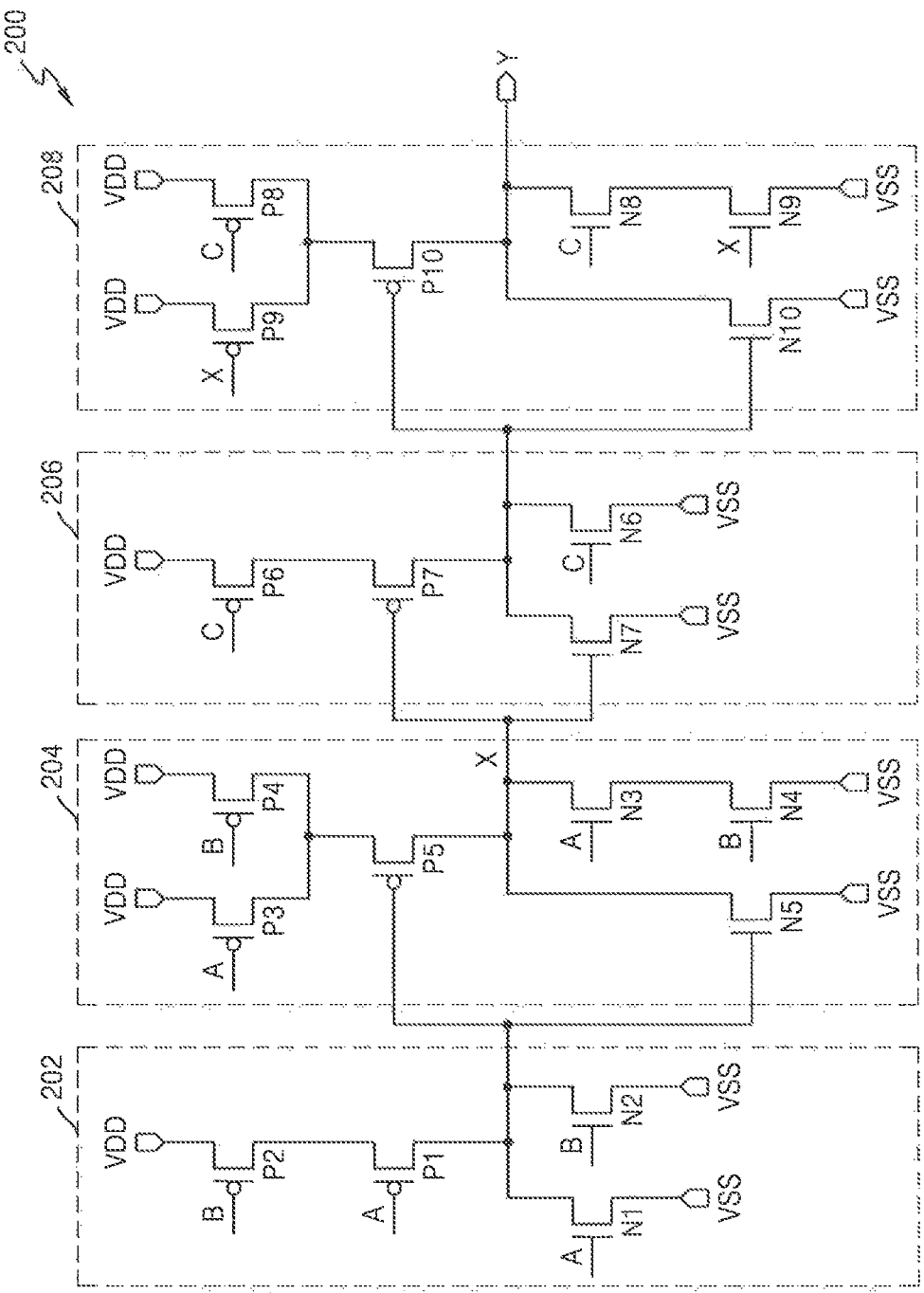
FIG. 3g illustrates a circuit diagram of a 3 input XOR gate comprising the NOR gate in the first block and the third block, according to exemplary embodiments of the present inventive concept.

FIG. 3*g* illustrates a circuit diagram of the 3 input XOR gate comprising the NOR gate in first block 202 and the third block 206, according to exemplary embodiments of the present inventive concept.

In an exemplary embodiment of the present inventive concept, the first block 202 comprising the PMOS transistors P1 and P2 in series and the NMOS transistors N1 and N2 in parallel, is configured to generate the first output signal corresponding to the NOR gate logic state. The second block 206 comprising the PMOS transistors P3 and P4 in parallel and the NMOS transistors N3 and N4 in series, is configured to receive the first input signal and the second input signal. The PMOS transistor P5 is connected in series with the PMOS transistors P3 and P4. The NMOS transistor N5 is connected in parallel with the NMOS transistors N3 and N4. The PMOS transistor P5 and the NMOS transistor N5 are configured to receive the first output signal from the first block 202. In an exemplary embodiment of the present inventive concept, the third block 206 comprising the PMOS transistors P6 and P7 in series and the NMOS transistors N6 and N7 in parallel, is configured to generate the third output signal corresponding to the NOR gate logic state. The fourth block 208 comprising the PMOS transistors P8 and P9 in parallel and the NMOS transistors N8 and N9 in series, is configured to receive the second output signal from the second block 204 and the third input signal. The PMOS transistor P10 is connected in series with the PMOS transistors P8 and P9. The NMOS transistor N10 is connected in parallel with the NMOS transistors N8 and N9. The PMOS transistor P10 and the NMOS transistor N10 are configured to receive the third output signal.

Figure 3H:
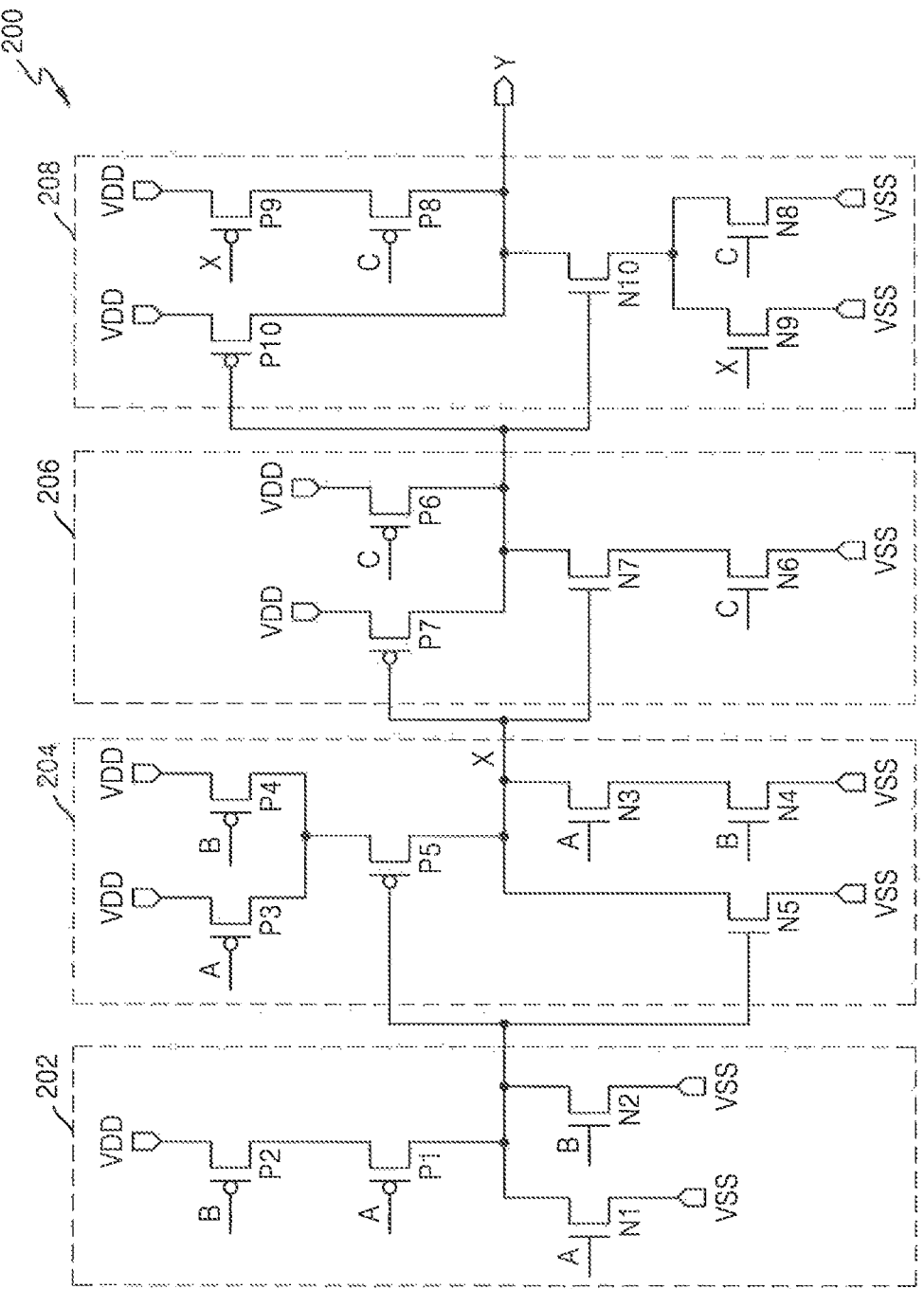
FIG. 3h illustrates a circuit diagram of a 3 input XNOR gate comprising the NOR gate in the first block and the NAND gate in the third block, according to exemplary embodiments of the present inventive concept.

FIG. 3*h* illustrates a circuit diagram of the 3 input XNOR gate comprising the NOR gate in first block 202 and NAND gate in the third block 206, according to exemplary embodiments of the present inventive concept.

In an exemplary embodiment of the present inventive concept, the first block 202 comprising the PMOS transistors P1 and P2 in series and the NMOS transistors N1 and N2 in parallel, is configured to generate the first output signal corresponding to the NOR gate logic state. The second block 204 comprising the PMOS transistors P3 and P4 in parallel and the NMOS transistors N3 and N4 in series, is configured to receive the first input signal and the second input signal. In the second block 204, the PMOS transistor P5 is connected in series with the PMOS transistors P3 and P4. In the second block 204, the NMOS transistor N5 is connected in parallel with the NMOS transistors N3, and N4. The first output signal from the first block 202 is inputted to the second block 204 via the input node of the PMOS transistor P5 and the NMOS transistor N5. In an exemplary embodiment of the present inventive concept, the third block 206 comprising the PMOS transistor P6 and P7 in parallel and the NMOS transistor N6 and N7 in series, is configured to receive the second output signal and the third input signal via an input node of the PMOS and NMOS transistors P7 and N7 and the PMOS and NMOS transistors P6 and N6 respectively. In an exemplary embodiment of the present inventive concept, the fourth block 208 comprising the PMOS transistors P8 and P9 in series and the NMOS transistors N8 and N9 in parallel, is configured to receive the second output signal and the third input signal. In the fourth block 208, the PMOS transistor P10 is connected in parallel with the PMOS transistors P8 and P9 and the NMOS transistor N10 is connected in series with the NMOS transistors N8 and N9. The fourth block 208 is configured to receive the third output signal via an input node.

It is to be understood that the fifth block 210 comprising the inverter gate circuit, may be coupled to the output node of the fourth block 208 in each of FIGS. 3*e*-3*h*, to generate the fifth output signal using the fourth output signal received via the input node of the PMOS transistor P11 and the NMOS transistor N11.

Figure 4A:
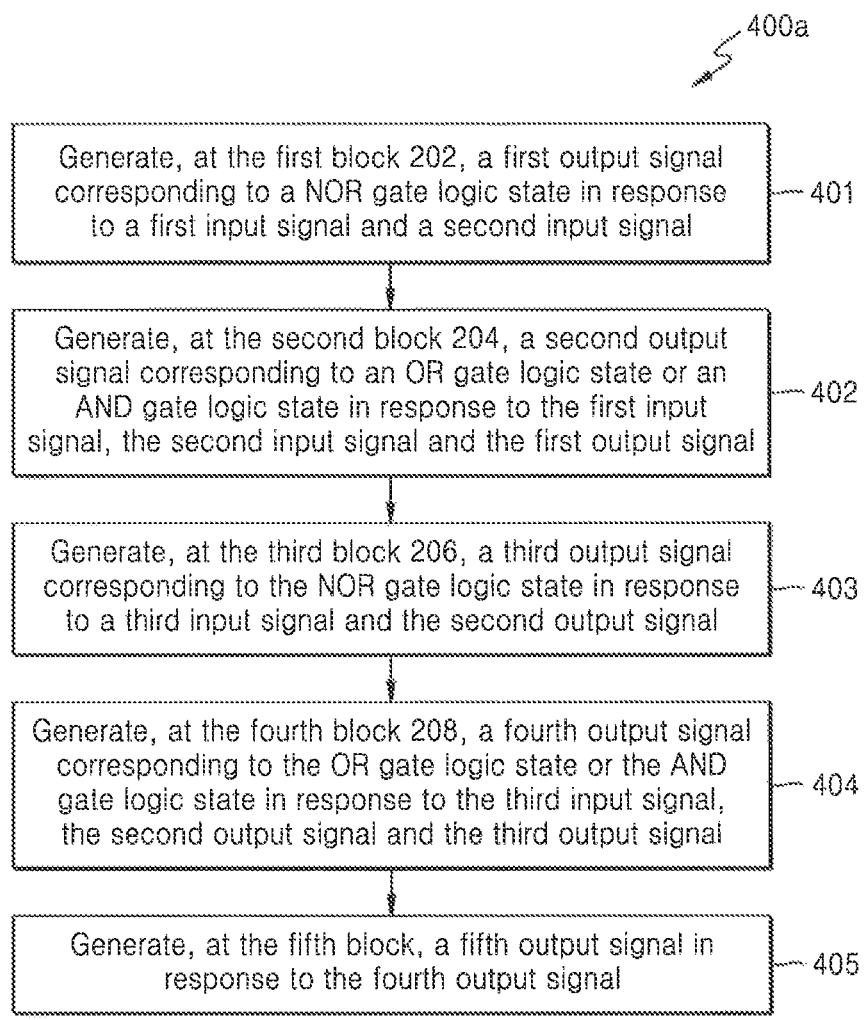
FIG. 4a illustrates a flow chart of a method for implementing an XNOR function using a CMOS transistor circuit, according to exemplary embodiments of the present inventive concept.

FIG. 4*a* illustrates a flow chart of a method 400*a* for implementing a XNOR function using a CMOS transistor circuit, according to exemplary embodiments of the present inventive concept.

In FIGS. 2 and 4*a*, the method 400*a* includes generating, at the first block 202, a first output signal corresponding to a NOR gate logic state in response to a first input signal and a second input signal (401). The method 400*a* further includes generating, at the second block 204, a second output signal corresponding to an OR gate logic state or an AND gate logic state in response to the first input signal, the second input signal and the first output signal (402). The method 400*a* further includes generating, at the third block 206, a third output signal corresponding to the NOR gate logic state in response to a third input signal and the second output signal (403). The method 400*a* further includes generating, at the fourth block 208, a fourth output signal corresponding to the OR gate logic state or the AND gate logic state in response to the third input signal, the second output signal and the third output signal (404). The method 400*a* further includes generating, at the fifth block, a fifth output signal in response to the fourth output signal (405).

The various actions in method 400*a* may be performed in the order presented, in a different order or simultaneously. Further, in some embodiments of the inventive concept, some actions listed in FIG. 4*a* may be omitted.

Figure 4B:
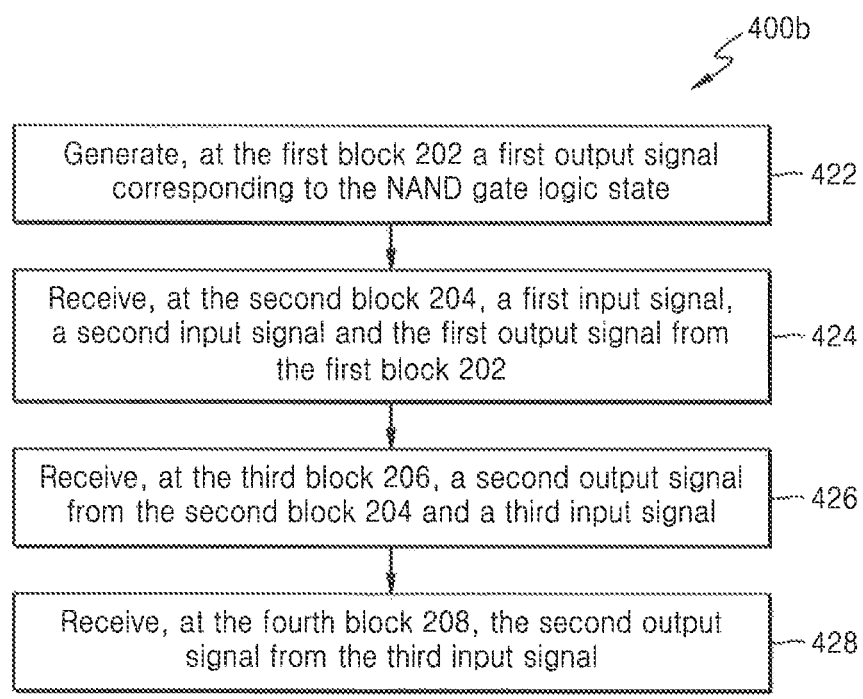
FIG. 4b illustrates a flow chart of a method for implementing the 3 input XNOR gate comprising the NAND gate circuit in both the first block and the third block, according to exemplary embodiments of the present inventive concept.

FIG. 4*b* illustrates a flow chart of a method 400*b* for implementing the 3 input XNOR gate comprising the NAND gate circuit in both the first block 202 and the third block 206, according to exemplary embodiments of the present inventive concept.

In FIGS. 3*a* and 4*b*, the method 400*b* includes generating, at the first block 202 a first output signal corresponding to the NAND gate logic state (422), receiving, at the second block 204, a first input signal, a second input signal and the first output signal from the first block 202 (424), receiving, at the third block 206, a second output signal from the second block 204 and a third input signal (426), and receiving, at the fourth block 208, the second output signal from the third input signal (428).

The various actions in method 400*b* may be performed in the order presented, in a different order or simultaneously. Further, in some embodiments of the inventive concept, some actions listed in FIG. 4*b* may be omitted.

Figure 4C:
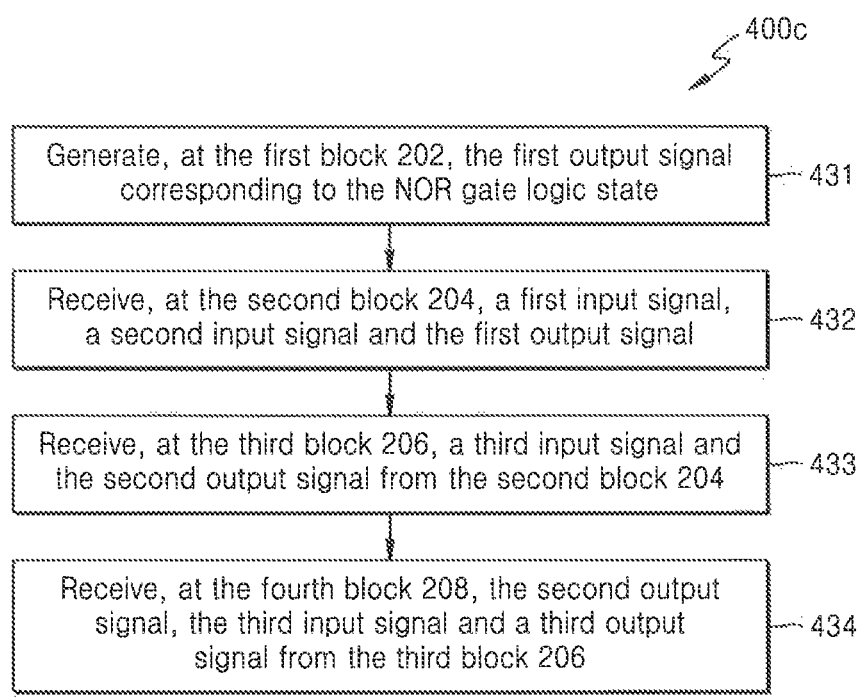
FIG. 4c illustrates a flow chart of a method for implementing an XOR function of three input signals, according to exemplary embodiments of the present inventive concept.

FIG. 4*c* illustrates a flow chart of a method 400*c* for implementing an XOR function of three input signals, according to exemplary embodiments of the present inventive concept.

In FIGS. 3*b* and 4*c*, the method 400*c* includes generating, at the first block 202, the first output signal corresponding to the NOR gate logic state (431), receiving, at the second block 204, a first input signal, a second input signal and the first output signal (432), receiving, at the third block 206, a third input signal and the second output signal from the second block 204 (433), and receiving, at the fourth block 208, the second output signal, the third input signal and a third output signal from the third block 206 (434).

The various actions in method 400c may be performed in the order presented, in a different order or simultaneously. Further, in some embodiments of the inventive concept, some actions listed in FIG. 4c may be omitted.

Figure 4D:
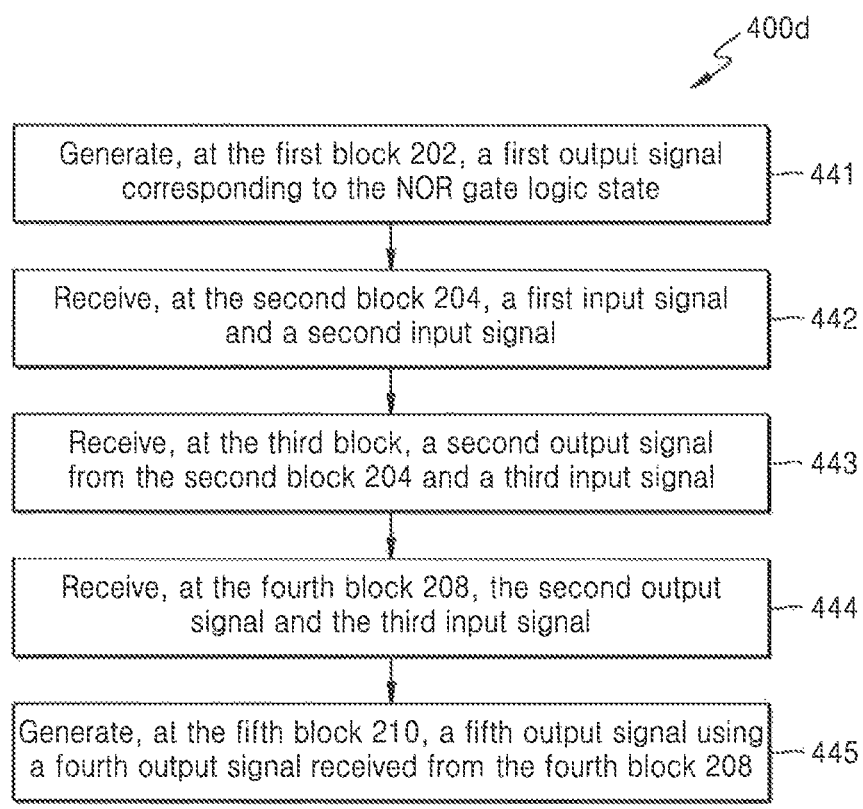
FIG. 4d illustrates a flow chart of a method for an XOR gate comprising the NOR gate in first block and the NAND gate in third block, according to exemplary embodiments of the present inventive concept.

FIG. 4d illustrates a flow chart of a method 400d for an XOR gate comprising the NOR gate in first block 202 and the NAND gate in third block 206, according to exemplary embodiments of the present inventive concept.

In FIGS. 3c and 4d, the method 400d includes generating, at the first block 202, a first output signal corresponding to the NOR gate logic state (441), receiving, at the second block 204, a first input signal and a second input signal (442), receiving, at the third block, a second output signal from the second block 204 and a third input signal (443), receiving, at the fourth block 208, the second output signal and the third input signal (444), and generating, at the fifth block 210, a fifth output signal using a fourth output signal received from the fourth block 208 (445).

The various actions in method 400d may be performed in the order presented, in a different order or simultaneously. Further, in some embodiments of the inventive concept, some actions listed in FIG. 4d may be omitted.

As described above, the exemplary embodiments of the present inventive concept disclosed herein provide an improved XNOR/XOR gate circuit that achieves a balance between performance and size. The XNOR/XOR gate circuit may be adapted for use in a variety of applications including combinational logic design, adder circuits, parity check, and so on. Further, the XNOR/XOR gate circuit may be adapted to provide XOR or XNOR functions for three, four, or more input signals. Exemplary embodiments of the inventive concept presented herein disclose the XOR-XNOR topology with a 2 stage NAND/NOR type in conjunction with the AND-OR (AO) or OR-AND (OA) type topology. Exemplary embodiments of the inventive concept presented herein eliminate the use of a transmission gate/pass gate type, since designs that include the transmission gate/pass gate type may consume lot of circuit area either due to diffusion breaks in the layout or due the number of input inverters. Exemplary embodiments of the inventive concept presented herein may eliminate the need for input inverters, in turn reducing the leakage contribution of the inverters. Exemplary embodiments of the inventive concept presented herein may be based on a CMOS type topology that may provide layout benefit in that it can share drain and source terminals, in comparison to the transmission gate type. Exemplary embodiments of the inventive concept presented herein may provide a better placement of the PMOS and the NMOS transistors by the sharing of a source/drain terminal due to circuit symmetry. Exemplary embodiments of the inventive concept presented herein may provide a better routing option and may save area by using fewer grids.

While the present inventive concept has been particularly shown and described with reference to exemplary embodiments thereof, it will be understood that various changes in form and details may be made thereto without departing from the spirit and scope of the present inventive concept as set forth in the following claims.

What is claimed is:

1. A Complementary Metal Oxide Semiconductor (CMOS) transistor circuit configured to implement an exclusive NOR (XNOR) function comprising:
a first block configured to generate a first output signal corresponding to a NOR gate logic state, in response to a first input signal and a second input signal;
a second block comprising a first AND-OR gate connected with an output node of the first block, wherein the second block is configured to generate a second output signal corresponding to an OR gate logic state or an AND gate logic state, wherein the second block is configured to receive the first input signal, the second input signal and the first output signal of the first block;
a third block connected with an output node of the second block, wherein the third block is configured to generate a third output signal corresponding to the NOR gate logic state, in response to a third input signal and the second output signal of the second block;
a fourth block comprising a second AND-OR gate circuit connected with an output node of the third block, wherein the fourth block is configured to generate a fourth output signal corresponding to the OR gate logic state or the AND gate logic state in response to the third input signal, the second output signal of the second block and the third output signal of the third block; and
a fifth block comprising an inverter gate circuit connected with an output node of the fourth block, wherein the fifth Hock is configured to generate a fifth output signal in response to the fourth output signal of the fourth block,
wherein the first block comprises first and second p-channel Metal Oxide Semiconductor (PMOS) transistors in series and first and second n-channel Metal Oxide transistors in parallel, wherein the second PMOS transistor is directly connected to a power supply voltage.

2. The CMOS transistor circuit as claimed in claim 1, wherein the second block comprises third and fourth p-channel Metal Oxide Semiconductor (PMOS) transistors in parallel and third and fourth n-channel Metal Oxide Semiconductor (NMOS) transistors in series, wherein the second block is configured to receive the first output signal from the first block via an input node of a fifth PMOS transistor and an input node of a fifth NMOS transistor.

3. The CMOS transistor circuit as claimed in claim 1, wherein the third block comprises sixth and seventh p-channel Metal Oxide Semiconductor (PMOS) transistors in series and sixth and seventh n-channel Metal Oxide Semiconductor (NMOS) transistors in parallel, wherein the sixth PMOS transistor is directly connected to the power supply voltage, and wherein the third block is configured to receive the second output signal via an input node of each of the seventh PMOS and NMOS transistors and receive the third input signal via an input node of each of the sixth PMOS and NMOS transistors.

4. The CMOS transistor circuit as claimed in claim 1, wherein the fourth block comprises eighth and ninth p-channel Metal Oxide Semiconductor (PMOS) transistors in parallel and eighth and ninth n-channel Metal Oxide Semiconductor NMOS transistors in series, wherein the fourth block is configured to receive the third output signal via an input node of a tenth PMOS transistor that is connected in series with the eighth and ninth PMOS transistors and a tenth NMOS transistor that is connected in parallel with the eighth and ninth NMOS transistors.

5. The CMOS transistor circuit as claimed in claim 1, wherein the fifth block is configured to generate the fifth output signal using the fourth output signal received via an input node of an eleventh p-channel Metal Oxide Semiconductor (PMOS) transistor and an input node of an eleventh n-channel Metal Oxide Semiconductor (NMOS) transistor.

6. The CMOS transistor circuit as claimed in claim 1, wherein the first output signal of the first block is inputted to the second block via an input node of a fifth p-channel Metal Oxide Semiconductor (PMOS) transistor and an input node of a fifth n-channel Metal Oxide Semiconductor (NMOS) transistor, wherein the fifth PMOS transistor is in series with third and fourth PMOS transistors of the second block and the fifth NMOS transistor is in parallel with third and fourth NMOS transistors of the second block.

7. The CMOS transistor circuit as claimed in claim 1, wherein the first block, the second block, the third block, the fourth block and the fifth block are connected in series with or parallel to each other.

8. The CMOS transistor circuit as claimed in claim 1, wherein the CMOS transistor circuit comprises a plurality of pull-up p-channel Metal Oxide Semiconductor (PMOS) transistors and a plurality of pull down n-channel Metal Oxide Semiconductor (NMOS) transistors.

* * * * *